United States Patent
Kinsman et al.

(10) Patent No.: US 6,773,965 B2
(45) Date of Patent: Aug. 10, 2004

(54) SEMICONDUCTOR DEVICE, BALL GRID ARRAY CONNECTION SYSTEM, AND METHOD OF MAKING

(75) Inventors: Larry D. Kinsman, Boise, ID (US); Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 87 days.

(21) Appl. No.: 10/119,192

(22) Filed: Apr. 10, 2002

(65) Prior Publication Data

US 2002/0121688 A1 Sep. 5, 2002

Related U.S. Application Data

(60) Continuation-in-part of application No. 09/653,410, filed on Aug. 21, 2000, now Pat. No. 6,372,552, which is a division of application No. 09/317,957, filed on May 25, 1999, now Pat. No. 6,268,650.

(51) Int. Cl.[7] .............................................. H01L 21/44
(52) U.S. Cl. ...................... 438/124; 438/118; 438/125; 257/686; 257/700
(58) Field of Search ................................ 438/124, 110, 438/111, 118, 123, 125; 257/686, 700, 691

(56) References Cited

U.S. PATENT DOCUMENTS

| | | |
|---|---|---|
| 4,951,123 A | 8/1990 | Lee et al. |
| 5,155,067 A | 10/1992 | Wood et al. |
| 5,677,566 A | 10/1997 | King et al. |
| 5,696,033 A | 12/1997 | Kinsman |
| 5,736,456 A | 4/1998 | Akram |
| 5,739,585 A | 4/1998 | Akram et al. |
| 5,789,803 A | 8/1998 | Kinsman |
| 5,817,535 A | 10/1998 | Akram |
| 5,849,635 A | 12/1998 | Akram et al. |
| 5,895,967 A | 4/1999 | Stearns et al. |
| 6,060,774 A | 5/2000 | Terui |
| 6,091,140 A | 7/2000 | Toh et al. |
| 6,137,164 A * | 10/2000 | Yew et al. .................. 257/686 |
| 6,580,619 B2 * | 6/2003 | Schoenborn ................ 361/780 |

FOREIGN PATENT DOCUMENTS

| | | |
|---|---|---|
| EP | 0854513 A2 | 7/1998 |
| JP | 10256455 A | 9/1998 |
| JP | 11317471 A | 11/1999 |

OTHER PUBLICATIONS

R. D. Schueller, Advanced Packing, Meeting performance and reliability criteria, May 1998, pp 28–34.

* cited by examiner

*Primary Examiner*—Caridad Everhart
(74) *Attorney, Agent, or Firm*—Dickstein Shapiro Morin & Oshinsky LLP (57) ABSTRACT

A semiconductor device is provided with a metal stiffening layer between the die and a multilayer structure comprising at least two insulating layers each having at least one conductor thereon. A top insulating layer of the multilayer structure contains a ball grid array. The metal layer is used as an electrical ground plane to simplify the routing pattern of conductive traces on the insulating material. The metal layer may also be used to dissipate heat from the die. The conductors of the multilayer structure provide additional versatility in wiring the die to the ball grid array.

44 Claims, 7 Drawing Sheets

SEMICONDUCTOR DEVICE, BALL GRID ARRAY CONNECTION SYSTEM, AND METHOD OF MAKING

This application is a continuation-in-part of application Ser. No. 09/653,410, filed Aug. 21, 2000, now U.S. Pat. No. 6,372,552, which is a divisional of application Ser. No. 09/317,957, filed May 25, 1999, now U.S. Pat. No. 6,268,650 B1. The entirety of each of these applications is hereby incorporated by reference.

BACKGROUND OF THE INVENTION

1. Field of the Invention

The present invention relates generally to structures for providing electrical connections and/or interconnections for semiconductor devices. More particularly, the invention relates to ball grid array (BGA) packages, and conductive structures for connecting integrated circuits to ball grid arrays, including fine ball grid arrays (FBGA). The present invention also relates to methods of making electronic devices and the like, particularly tape-based methods of manufacturing semiconductor devices.

2. Discussion of the Related Art

Ball grid array packages are known in the art. In one such product, a resin material is located on the active surface of a semiconductor die. Solder balls are formed on top of the resin material. Wires connect the bond pads on the die to conductive traces patterned on the resin material. The wires extend through an opening in the resin material. The traces communicate signals from the wires to the solder balls. The resin material may be cut from a continuous tape after the device is otherwise assembled, according to a known tape-based manufacturing method.

The known devices and manufacturing processes have several disadvantages. Among other things, it would be advantageous to incorporate a stiffening or reinforcing structure into the ball grid array package described above without substantially increasing its overall size. The desired structure would produce a durable, easier to handle product, and it would make it practicable to employ thinner and/or more flexible material for the tape.

In addition, it would be advantageous to provide a means for dissipating or distributing heat from the semiconductor die without substantially increasing the size or complexity of the device.

In addition, as the size of ball grid array devices are reduced and the number and complexity of the required electrical interconnections are increased, it becomes increasingly difficult to produce a satisfactory conductive routing pattern on the resin material. Thus, it would be advantageous to provide a system for connecting the die to the ball grid array with a simplified conductive routing pattern.

SUMMARY OF THE INVENTION

The disadvantages of the prior art are overcome to a great extent by the present invention. The present invention relates to a semiconductor device with improved structural, thermal and/or electrical performance characteristics. The present invention also relates to a method of packaging a semiconductor die for use with an external device such as a circuit board.

According to one aspect of the invention, a device is formed of a semiconductor die, a ball grid array for communicating with an external device (such as a circuit board), and an electrically insulative layer. The insulative layer supports the ball grid array. That is, the insulative layer is located between the ball grid array and the die. An electrically conductive layer is located between the insulative layer and the die. The conductive layer, which may be made of metal, provides structural support (stiffness) and also dissipates heat away from the die. The ball grid array is electrically connected to the die by wires, traces and/or other conductive elements. At least some of these elements are also connected to the conductive layer. Consequently, the conductive layer may be used as a common ground plane.

According to another aspect of the invention, open areas are provided in the metal layer and the insulative layer to accommodate metal wires that are connected to the active surface of the die.

According to another aspect of the invention, the insulative layer may be cut from a tape structure. Conductive traces are patterned on the tape to route signals to the ball grid array. Some of the wires attached to the die are also attached to the conductive traces. Other wires may be attached to the metal ground plane and are insulated from the traces.

One or more via holes may be provided to connect the metal ground plane to the desired one or more balls of the ball grid array.

In a preferred embodiment of the invention, the fragile conductive elements are glob top encapsulated in resin.

According to another aspect of the invention, an electronic device is formed of a semiconductor die, a patterned film, and a metal grounding layer. The metal layer is located between the die and the patterned film.

The film has electrical conductors (for example, conductive traces, via holes and solder balls) for providing communication between the die and an external device. An advantage of the invention is that the package containing the die may have a small footprint and reduced height, if desired.

The present invention may be employed with a die that has centrally located bond pads. In addition, the invention may be used in perimeter pad devices. Thus, the metal layer may have a smaller surface area than the die. In another embodiment of the invention, the metal layer has peripheral portions that extend laterally outwardly beyond the edges of the die, for example to provide room for additional rows of solder balls and/or to provide increased heat dissipation. In another embodiment of the invention, the metal layer has a recess that receives or contains the die to provide increased stiffness, protection and/or heat dissipation. The present invention is not limited to the preferred embodiments described herein.

The invention also relates to a tape-based process for producing semiconductor devices. In a preferred embodiment of the invention, a tape structure is formed of electrically insulative tape, a succession of semiconductor dies attached to the tape, and stiff metal grounding layers. The metal layers are located between the dies and the tape. A corresponding succession of ball grid arrays, wires, or other electrical connection systems, may be located on the tape. Thus, according to the invention, semiconductor devices, workpieces and/or electronic components may be formed according to a tape-based process and subsequently separated from each other.

The invention also includes a multilayer structure as an alternative to the supporting insulative layer. This multilayer structure can comprise a plurality of insulative layers and circuitry layers in electrical connection with the die, the ball grid array, and/or ground layers. Also, within the multilayer structure, additional grounding or power planes can be provided. The multilayer structure provides improved routability in wiring circuitry and easier ground and power wiring. One or more via holes may also be provided to connect the ball grid array to underlying circuitry or conductive planes incorporated within the multilayer structure.

The above-noted features and aspects of the invention can be combined with one another in many ways. These and other features and advantages will become apparent to those of skill in the art from the following detailed description in conjunction with the below described drawings.

DETAILED DESCRIPTION

Figure 1:
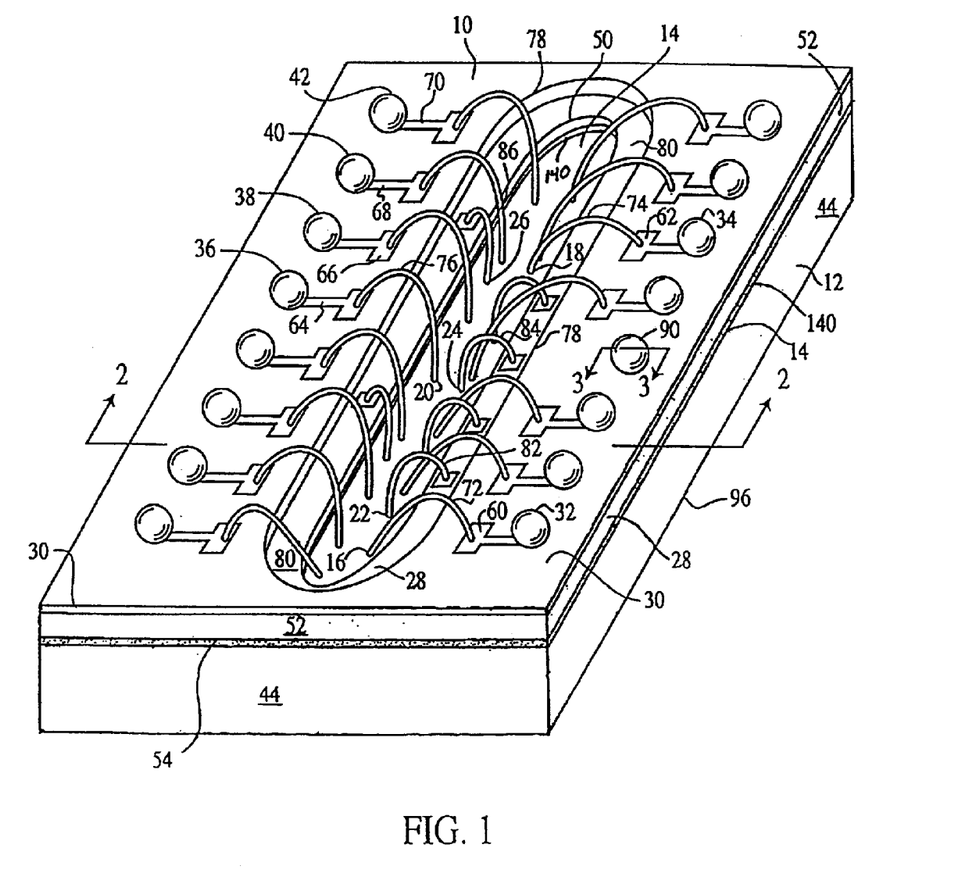
FIG. 1 is an isometric view of a semiconductor package constructed in accordance with a preferred embodiment of the present invention.

Referring now to the drawings, where like reference numerals refer to like elements, there is shown in FIG. 1 a board-on-chip (BOC) semiconductor device 10 constructed in accordance with the present invention. The device 10 has a semiconductor die 12 with an active top surface 14. The die 12 contains an integrated circuit (not shown). The integrated circuit is in electrical communication with bond pads 16, 18, 20, 22, 24, 26 on the active surface 14.

An electrically conductive layer 28 is located on the active surface 14. The conductive layer 28 may be formed of a stiff metal material. An electrically insulative plastic film (or laminate) 30 is located on the metal layer 28. A ball grid array (BGA) is located on the plastic layer 30. The ball grid array is formed of at least two rows of minute solder balls 32, 34, 36, 38, 40, 42. In a preferred embodiment of the invention, the solder balls 32–42 form a fine ball grid array (FBGA). The balls 32–42 may be formed of tin (Sn) and/or lead (Pb), for example.

An adhesive layer 140 may be located between the active surface 14 and the electrically conductive layer 28. The adhesive layer 140 provides an adhesive connection between the semiconductor die and the conductive layer 28. The adhesive layer 140 may be formed of a variety of suitable materials, including thermoplastic and thermoset type adhesive materials.

An advantage of the invention is that the ball grid array 32–42 may be located entirely within (or at least near) the periphery 44 of the semiconductor die 12. Thus, the present invention may be used to provide a semiconductor package that has a small footprint. The device 10 may occupy a reduced area on a circuit board, for example. This advantage is achieved, according to one aspect of the invention, by locating the metal layer 28 directly between the semiconductor die 12 and the plastic film 30.

In one embodiment, the metal layer 28 is coextensive with the active surface 14 of the semiconductor die 12, except for an open area 50 over the bond pads 16–26. That is, the peripheral edges 52 of the metal layer 28 may be aligned with the peripheral edges 44 of the semiconductor die 12. The metal layer 28 is preferably in direct, intimate contact with and extends continuously across the semiconductor active surface 14 (except for the open area 50). This way, the metal layer 28 forms an effective heat sink at its interface 54 with the die 12 to spread and/or dissipate heat from localized hot spots on the active surface 14. In the illustrated embodiment, the thin adhesive layer 140 does not prevent heat from dissipating from the active surface 14 to the metal layer 28.

Electrically conductive traces 60, 62, 64, 66, 68, 70 are patterned on the plastic film 30. The traces 60–70 are electrically connected to the respective balls 32–42 of the ball grid array. The traces 60–70 may be formed for example by depositing copper or aluminum in the desired pattern on the plastic film 30. A first group of metal wires 72, 74, 76 are attached to a corresponding group of bond pads 16, 18, 20, to electrically connect those bond pads 16–18 to respective solder balls 32, 34, 36. The wires 72–76 may be formed for example by a known leads-on-chip (LOC) wire bonding machine. An open area 78 is defined in a central portion of the plastic film 30. The open area 78 may be concentric with the open area 50 of the metal layer 28 and the bond pad portion of the active surface 14. The wires 72–76 extend through the aligned open areas 78, 50.

Figure 3:
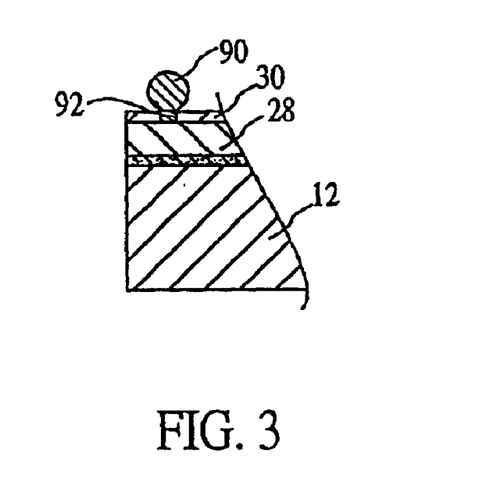
FIG. 3 is a cross sectional view of the semiconductor package of FIG. 1, taken along the line 3—3.

The open area 78 of the plastic film 30 may be larger than the open area 50 of the metal layer 28 to leave an exposed metal region (an inner bondable metal surface) 80. A second group of metal wires 82, 84, 86 are attached to and provide electrical communication between a second group of bond pads 22–26 and the exposed region 80 of the metal layer 28. Thus, the metal layer 28 forms a ground plane for the second group of bond pads 22–26. As shown in FIG. 3, the metal layer (ground plane) 28 may be electrically connected to one of the solder balls 90 through a via hole 92 formed in the plastic film 30. In an alternative embodiment of the invention, the metal layer 28 may be connected to the grounded ball 90 by a suitable wire.

By utilizing the metal ground plane 28 connected to one or more of the solder balls 90, the routing pattern of the traces 60–70 on the plastic film 30 may be simplified. The grounded solder ball 90 may be connected to an external ground when the device 10 is installed in a larger device, such as a circuit board (not illustrated).

Figure 2:
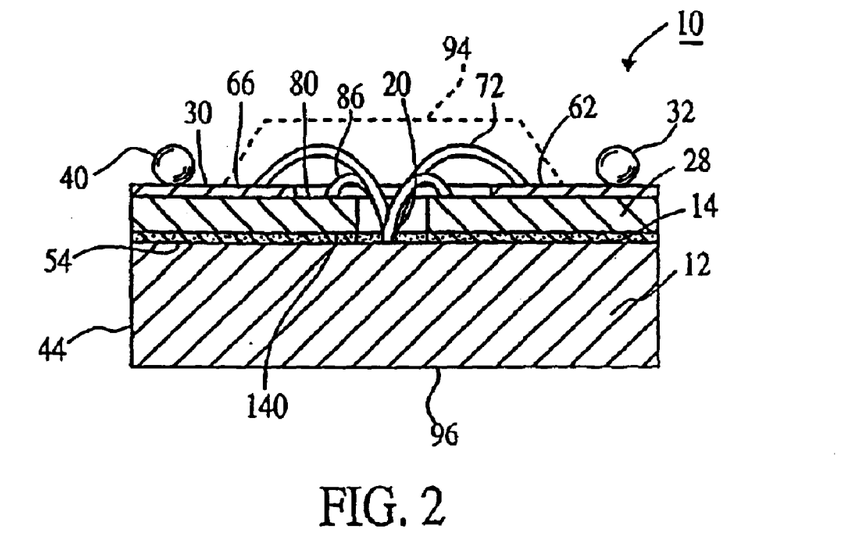
FIG. 2 is a cross sectional view of the semiconductor package of FIG. 1, taken along the line 2—2.

If desired, the wires 72–76, 82–86 and the bond pads 16–26 may be glob top encapsulated in a suitable resin 94. The encapsulant resin 94 is shown in dashed lines in FIG. 2. The resin 94 is not shown in FIG. 1 for the sake of clarity of illustration. In an alternative embodiment of the invention, the resin 94 may be formed by a transfer molding process. The transfer molded material may be silica filled epoxy molding compound, for example. In yet another embodiment of the invention, the wires 72–76, 82–86 and the bond pads 16–26 may be covered by a pre-molded or stamped lid (not illustrated). The lid may be adhered by glue at the desired location. The present invention should not be limited to the specific embodiments show and described herein.

In a preferred embodiment of the invention, the metal layer 28 may be used to provide the desired stiffness for the finished device 10. The metal layer 28 is preferably adhered to the plastic film 30. According to one aspect of the invention, there is no need for a metal layer or any other stiffening structure on the bottom surface 96 of the semiconductor die 12. Eliminating the need for a metal layer on the bottom 96 of the die 12 contributes to a package with a low profile in the vertical (top-to-bottom) direction. The stiffness provided by the metal layer 28 (between the die 12 and the plastic film 30) makes it easier to handle the patterned film 30 without creating defects in the device 10. At the same time, the electrical connections provided by the metal layer (ground plane) 28 reduce the complexity of the routing of the traces 60–70, all of which provide for a robust packaging process with fewer defects.

Figure 4:
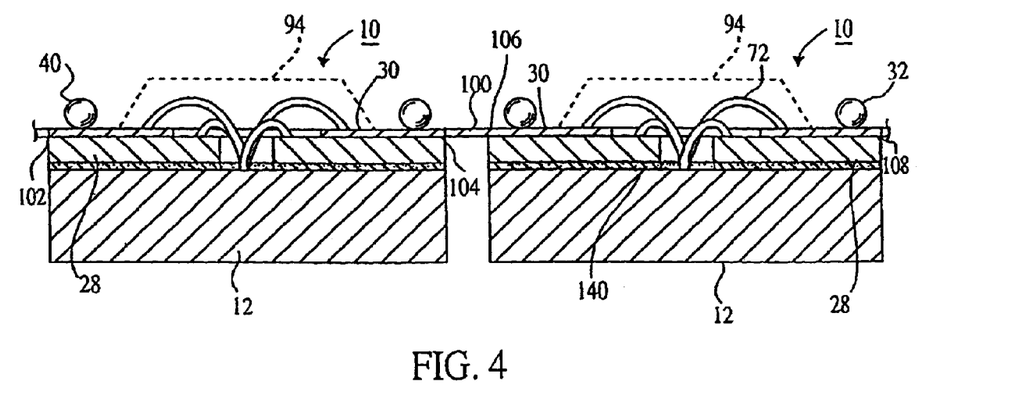
FIG. 4 is a cross sectional view like FIG. 2, showing the semiconductor package as part of a tape structure at an intermediate stage of production.

Referring now to FIG. 4, a plurality of semiconductor devices 10 may be formed as a tape structure and subsequently separated from each other. In the illustrated embodiment, the tape structure has an indefinite length plastic tape 100 that is subsequently cut along lines 102, 104, 106, 108 to separate the devices 10 from each other. Metal layers 28 are connected to the flexible tape 100 at spaced apart locations. Since the tape 100 is reinforced by the metal layers 28, the tape 100 may be formed of flexible materials, such as thin films of Uniplex or Kapton brand polyimide materials. Alternatively, the tape 100 may be formed of a known BT resin and/or a glass impregnated FR4 material. In another embodiment of the invention, the tape structure may be formed of a strip of metal with patches of tape at the sites where the devices are located.

Semiconductor dies 12 may be adhered to the metal layers 28 before or after the metal layers 28 are adhered to the tape 100. After the metal layers 28 are connected to the tape 100, the wires 72–76, 82–86 are connected to the bond pads 16–26, the patterned traces 60–70 and the bond locations on the exposed region 80 of the metal layer 28. The solder balls 32–42, 90 are placed on the tape 100, and the glob top encapsulant resin 94 is applied by a known technique. Subsequently, the tape 100 is cut at the lines 102–108 to produce individual packaged semiconductor devices.

Figure 5:
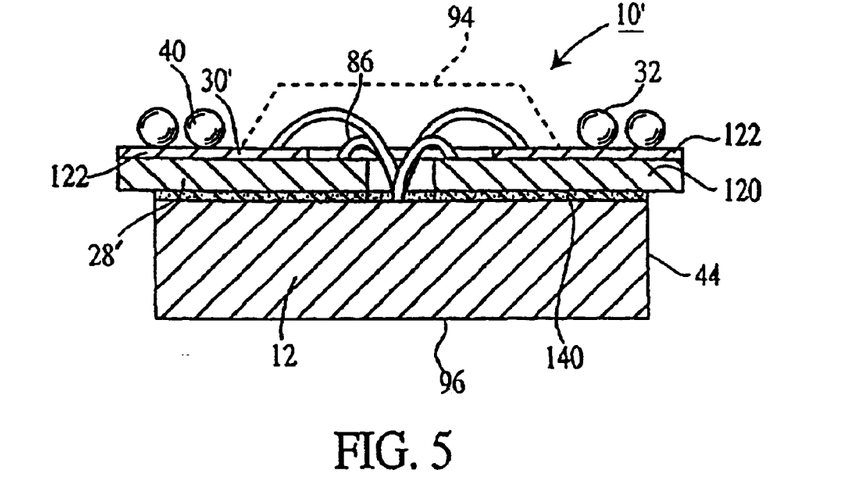
FIG. 5 is a cross sectional view of another semiconductor package constructed in accordance with the present invention.

Referring now to FIG. 5, the metal layer 28' and plastic film 30' may be provided with peripheral portions 120, 122 that extend laterally outwardly beyond the peripheral edges 44 of the semiconductor die 12. The illustrated arrangement may be useful where additional area on top of the plastic film 30' is desired to conveniently fit all of the solder balls 32–42, 90 in the desired positions for communication with one or more external devices.

Figure 6:
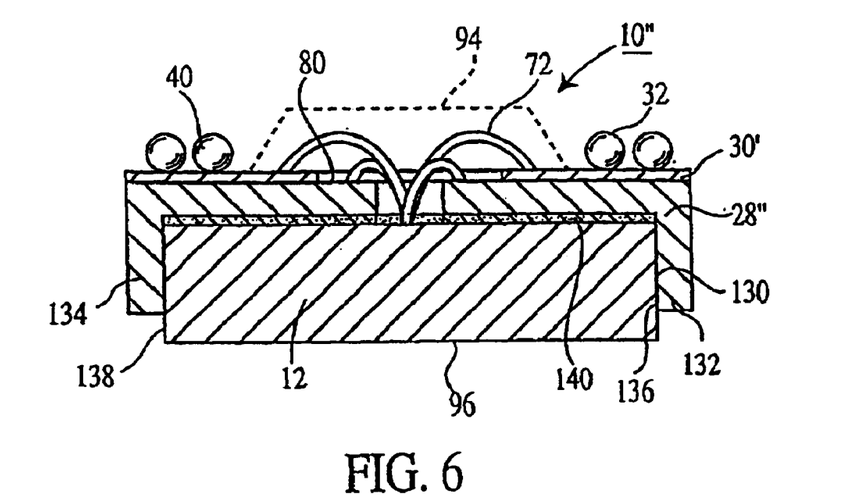
FIG. 6 is a cross sectional view of yet another semiconductor package constructed in accordance with the present invention.

FIG. 6 shows another device 10" constructed in accordance with the present invention. The metal layer 28" for the illustrated device 10" has a recess 130. The semiconductor die 12 fits into the recess 130. The device 10" may have improved stiffness provided by the metal 132, 134 integrally formed on the sides 136, 138 of the die 12, without increasing the overall vertical height of the finished product. In addition, the recess 130 may be useful for absorbing heat from the sides 136, 138 of the die 12.

Figure 7:
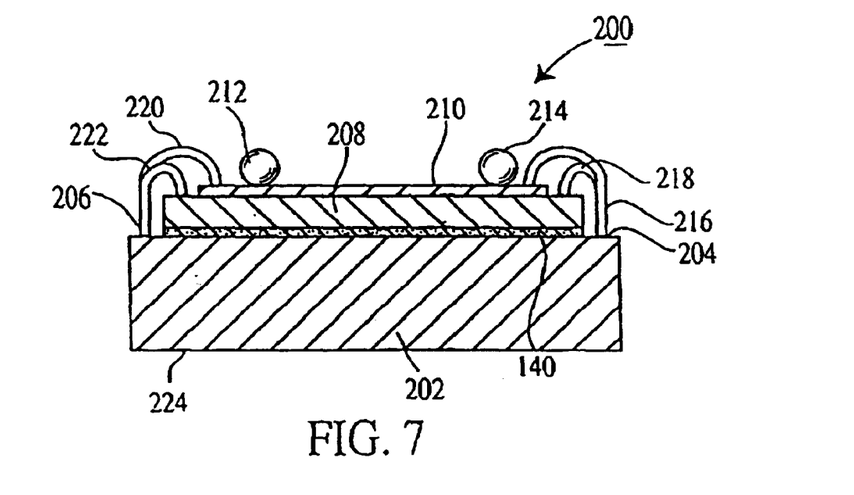
FIG. 7 is a cross sectional view of yet another semiconductor package constructed in accordance with the present invention.

The present invention is not limited to the preferred embodiments shown and described herein. FIG. 7 illustrates, for example, how the invention may be used to construct a ball grid array device 200 with a perimeter pad design. The illustrated device 200 has a semiconductor die 202 with numerous peripheral bond pads 204,206, only two of which are identified in the drawings. A metal layer 208 is formed on the active top surface of the semiconductor die 202. The metal layer 208 does not cover the bond pads 204, 206.

A plastic resin layer 210 is adhered to the metal layer 208. The plastic layer 210 may have conductive traces and solder balls 212, 214 formed therein similar to the arrangements shown in FIGS. 1–6. Wires 216, 218, 220, 222 selectively connect the bond pads 204, 206 to the metal layer 208 and the traces connected to the solder balls 212, 214. The electrical connections are similar to those shown in FIGS. 1–6 except that the wires 216–222 extend inwardly from the periphery of the die 202, rather than outwardly from the center thereof.

Like the metal layer 28 discussed above, the metal layer 208 of the FIG. 7 device 200 may perform the multiple functions of stiffening the product, serving as a heat sink for the semiconductor die 202, and providing an electrical ground plane to reduce the complexity of the routing for the traces on the plastic film 210. The metal layer 208 performs these functions in a product 200 that has a relatively small footprint (an area less than that of the die 202) and a low vertical profile. The FIG. 7 device 200 does not require a metal layer under the bottom surface 224 of the die 202.

Figure 10:
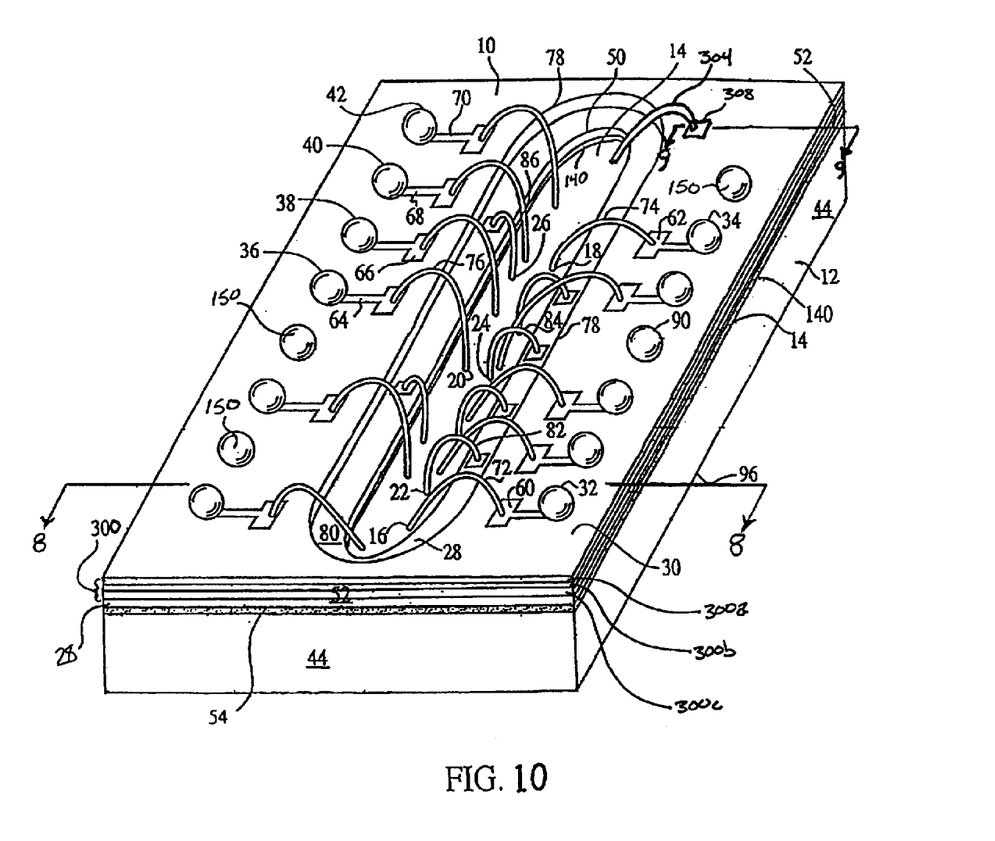
FIG. 10 is an isometric view of a semiconductor package constructed in accordance with an embodiment of the invention.

FIG. 10 shows an alternative embodiment of the board-on-chip (BOC) semiconductor device 10 shown in FIG. 1, which except as noted below, is formed the same way as shown in FIG. 1 and discussed above. As with the embodiment shown in FIG. 1, the device 10 has a semiconductor die 12 with an active top surface 14. The die 12 contains an integrated circuit as is known in the art. The integrated circuit of the die 12 is in electrical communication with bond pads 16, 18, 20, 22, 24, 26 on its active surface 14. As alternative to the insulative plastic film 30 of FIG. 1, FIG. 10 shows that this film can be replaced by a multilayer film structure 300, which can provide the same insulating characteristics as layer 30 and include several layers of insulators and conductive patterning. The specific number of layers in the multilayer film structure 300 can be varied in accordance with the desired use and packaging for the overall semiconductor device.

The multilayer film structure 300 shown in FIG. 10 can have one or more insulating layers 300a, 300b, 300c, formed, at least in part, of the same or similar materials as layer 30 of FIG. 1, including, for example, plastic, tape, a dielectric layering, or other materials known in the art to have similar insulative characteristics. In fact, the multilayer film structures 300 can be a structure like the tape 100 discussed above in relation to FIG. 4, but which contains the additional layering discussed here. The multilayer film structure 300 can also include patterned circuitry conductors on one or more of the insulating layers 300a, 300b, 300c, or a planar ground or power plate on one or more of layers 300b, 300c as desired or appropriate. The patterned circuitry and/or planner conductor provided on insulating layers 300a, 300b, 300c, of the multilayer film structure 300 can be used to simplify the wiring of the die 12 to the ball grid array and/or provide a power or ground plane. FIG. 10 shows conductive traces e.g. denoted as 60, 62, 64, 66, 68, 70 provided on an upper insulating layer 300a, similar to the FIG. 1 embodiment. In addition, insulating layers 300b, 300c of the multi-layer structure 300 can support other conductor layers as a wiring pattern or planar ground or power planes.

The multi-layer structure 300 provides advantages such as increasing the routability for circuit connections that would otherwise be difficult to make and by offering multiple patterned or planar conductor planes, which can be used to facilitate connection of the die 12 to the ball grid array 32–42. For example, bond pads 308 and solder balls 150 on opposite ends of the device 10, as shown in FIG. 10, can be more readily connected to one another, if necessary, through an intermediate wiring pattern of the multilayer structure 300, which can be provided on an insulating sub-layer 300b or 300c. This is achieved by connecting the active surface 14 of the die 12 to a bond pad 308 on the top layer 300a of the multilayer film 300 by a wire 304. The bond pad 308 is in electrical contact with the underlying circuitry patterned on one of the sub-layers 300b or 300c. The patterned circuitry of this sub-layer 300b, 300c is in electrical contact with the solder ball 150. The connection to underlying patterned circuitry is discussed below in reference to FIG. 9. Another advantage of the multilayer film structure 300 is that additional power and/or ground planes can be provided on one or both of sub-layers 300b or 300c. The connection to these additional planes is also discussed below in reference to FIG. 9.

Figure 8:
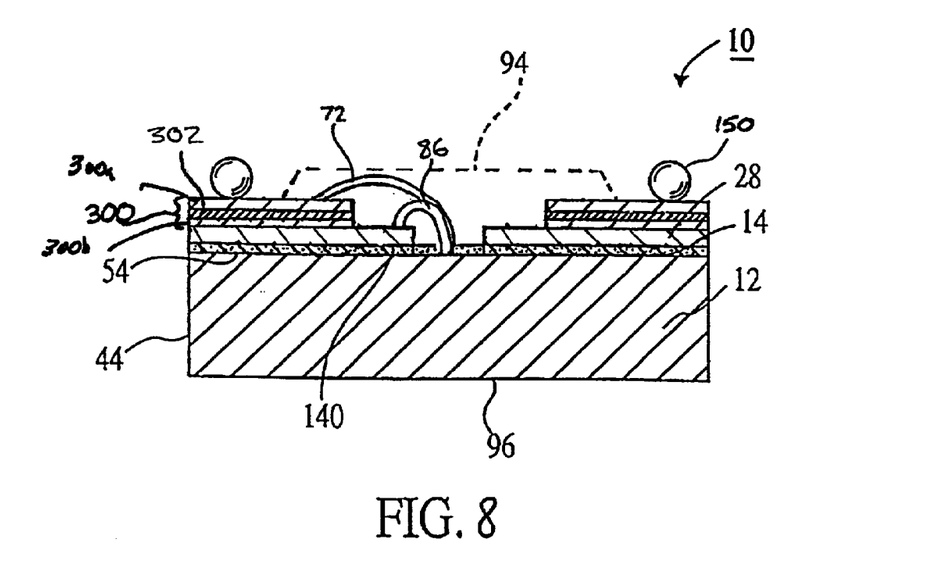
FIG. 8 is a cross sectional view of the semiconductor package of FIG. 10, taken along the line 8—8.

FIG. 8 illustrates one arrangement for multilayer structure 300. A conductive plane 302 is provided between two insulating layers 300a, 300b (a third insulating layer 300c is omitted in this embodiment) as a continuous conductive layer (coplanar with the multilayer structure 300). The conductive plane 302 can supplement layer 28, and is electrically insulated from layer 28 by insulating sub layer 300b. This conductive plane 302 can serve many of the same functions as the metal layer 28 discussed above in reference to FIGS. 1–7, though it would not necessarily be intended to provided similar structural support for the overall device 10 and therefore would not have to be as stiff or thick as layer 28. For instance, the conductive plane 302 can provide a ground plane in addition to that of layer 28 and be connected to the die 12 circuitry in a fashion similar to layer 28 by wiring the die 12 to a bond pad 308 in electrical contact with the conductive plane 302. Also, the conductive plane 302 can provide a power plane or an additional heat sink layer.

Figure 9:
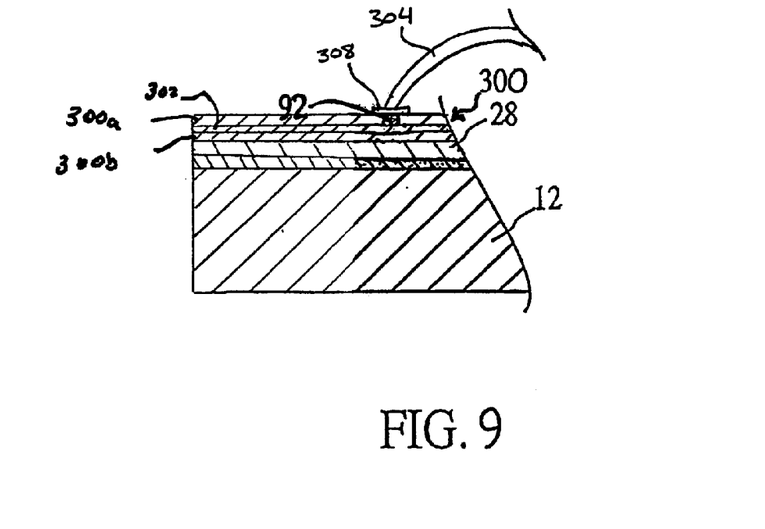
FIG. 9 is a cross sectional view of the semiconductor package of FIG. 10, taken along the line 9—9.

FIG. 9, shows how a die 12 can be connected to conductive plane 302 through one or more conductive vias 92 provided through one or more of the layers of the multilayer film structure 300. As shown in FIG. 9 conductive via 92 extends through insulating layer 300a and provides a bond pad 308 for die wiring 304. Of course, conductive layer 302 may be a patterned wiring layer instead of a conductive plane to facilitate die wiring and interconnection to the balls 150 of the ball grid array. In this way, the footprint and wiring of the device 10 can remain the same and as simple as shown in FIG. 1, but additional wiring routability, or additional ground or power plane wiring options are achieved. Although FIGS. 8 and 9 show a single insulating sub-layer 300b and an associated conductor layer 302, it should be noted that additional insulating sub-layers, e.g. 300c of FIG. 10, can also be provided supporting another conductive layer as a conductive plane or wiring pattern. Also, the associate conductor on insulating sub-layers 300b or 300c may be connected by a conductive via 92 to either die 28 or a ball 150 of the ball grid array.

The above description, examples, and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. Accordingly, the invention is not to be considered as being limited by the foregoing description, but is only limited by the scope of the appended claims.

What is claimed as new and desired to be protected by Letters Patent of the United States is:

1. A semiconductor device, comprising:
   a semiconductor die;
   a ball grid array configured to communicate with an external device;
   a multilayer structure located between said ball grid array and said semiconductor die, said multilayer structure comprising a top insulating layer and at least one insulating sub-layer, said top insulating layer supporting at least one first electrical conductor and said at least one insulating sub-layer supporting at least one second electrical conductor;
   a first electrical connection between said at least one first electrical conductor and said semiconductor die;
   a second electrical connection between said at least one second electrical conductor and a ball of said ball grid array and said die; and
   a conductive layer provided between said multi-layer structure and said die.

2. A semiconductor device as in claim 1 wherein said conductive layer is a heat conductor providing heat dissipation for said semiconductor device.

3. The semiconductor device of claim 1, wherein said conductive layer is an electrical conductor providing a ground for said semiconductor device.

4. The semiconductor device of claim 1, wherein said top insulating layer supports said ball grid array.

5. The semiconductor device of claim 1, wherein said conductive layer provides stiffness to said semiconductor device.

6. The semiconductor device of claim 5, wherein said conductive layer defines an open area, and wherein at least one said first and second connections extends through said area.

7. The semiconductor device of claim 1, wherein at least said first electrical connection includes a metal wire.

8. The semiconductor device of claim 6, wherein said at least one first and second electrical conductors include conductive traces.

9. The semiconductor device of claim 7, wherein said metal wire is attached to said semiconductor die.

10. The semiconductor device of claim 1, wherein said multilayer structure defines an open area, and wherein at least said first electrical connection extends through said area.

11. The semiconductor device of claim 10, wherein said second electrical connection extends through said area and is coupled to said die.

12. The semiconductor device of claim 1, wherein said multilayer structure defines a conductive via, and wherein a bond pad is electrically connected to said second electrical conductor of said sub-layer through said via.

13. The semiconductor device of claim 1, wherein said multilayer structure further comprises at least one second electrically conductive layer between two insulating layers.

14. The semiconductor device of claim 1 wherein said at least one second electrical conductor is a ground plane.

15. The semiconductor device of claim 1 wherein said at least one second electrical conductor is a power plane.

16. A semiconductor package, comprising:
    a semiconductor die;

a multi-layer structure coupled to said semiconductor die, said multi-layer structure comprising a top insulating film and at least one other insulating film, said top insulating film supporting a first electrical conductor and said at least one other insulating film supporting a second electrical conductor;

a ball grid array coupled to electrical connections provided on or through said top insulating film;

a metal layer located between said die and said multi-layer structure, wherein said metal layer provides stiffness to said semiconductor package; and an encapsulant encapsulating at least a portion of said multi-layer structure.

17. The semiconductor package of claim 16, wherein said metal layer is in electrical contact with said semiconductor die.

18. The semiconductor package of claim 17, further comprising wires for connecting said semiconductor die to said first and second electrical conductors, and said metal layer.

19. The semiconductor package of claim 16, wherein said first electrical conductor includes an electrically conductive trace located on said top insulative film.

20. The semiconductor package of claim 16, wherein said ball grid array is electrically connected to said metal layer and second electrical conductor.

21. The semiconductor package of claim 16, wherein said second electrical conductor comprises a ground plane.

22. The semiconductor package of claim 16 wherein said second electrical conductor comprises a power plane.

23. A semiconductor device comprising:

a semiconductor die having a plurality of bond pads thereon;

a conductive layer adhered to said semiconductor die, said conductive layer being electrically connected to said at least one of said bond pads and configured to provide structural integrity for said semiconductor device;

a multilayer structure adhered to said conductive layer, said multilayer structure comprising a top insulating layer and at least two insulating sub-layers, at least one first electrical conductor provided on said top layer, at least one second electrical conductor provided on one of said two insulating sub-layers, and at least one third electrical conductor provided on the other of said two insulating sub-layers; and a ball grid array configured to communicate with an external device and electrically connected to at least one of said bond pads, and said first, second, and third conductors each being electrically connected to said ball grid array and said bond pads of said die.

24. The device of claim 23, wherein said die has an active surface at a central portion thereof, said bond pads being located at said central portion.

25. The device of claim 24, wherein said ball grid array includes first and second spaced groups of solder balls, and wherein said bond pads are located between said spaced first and second groups of solder balls.

26. The device of claim 23, further comprising at least one bond pad on said top insulative layer, said one bond pad being in electrical connection with said at least one second electrical conductor.

27. The device of claim 23, wherein said multilayer structure further comprises a conductive plane between said at least two insulative sub-layers, said conductive plane being in electrical communication with at least one die bond pad.

28. The device of claim 27, wherein said conductive plane is a ground plane.

29. The device of claim 27 wherein said conductive plane is a power plane.

30. A structure for coupling to and providing wiring paths for semiconductor devices, said structure comprising:

a multi-layer structure comprising a top insulating layer and at least one insulating sub-layer, said top insulating layer having at least one first electrical conductor thereon said at least one insulating sub-layer having at least one second electrical conductor thereon;

a metal layer coupled to said multi-layer structure; and an adhesive layer provided on a surface of said metal layer for adhering said multi-layer structure and metal layer to a semiconductor die.

31. The structure of claim 30, further comprising a ball grid array provided on said top insulating layer, said ball grid array being connected with at least one of said first and second conductors.

32. The structure of claim 30 wherein said multilayer structure further comprises two insulating sublayers, having a respective second and third conductors thereon.

33. The structure of claim 30 wherein said second electrical conductor is a planar conductor.

34. A method of making a semiconductor device, said method comprising the steps of:

coupling a multi-layer structure having a defined open area therein to a semiconductor die, said multilayer structure comprising a top insulating layer and at least one insulating sub-layer, each of said insulating layers containing electrical conductors;

forming a ball grid array on said top insulating layer; and forming electrical connections through said open area between said semiconductor die and said ball grid array, using said electrical conductors.

35. The method of claim 34, further comprising the step of encapsulating at least some said electrical connections in resin.

36. The method of claim 34 further comprising provides an electrically conducting layer between said multilayer structure and said die.

37. The method of claim 34, wherein at least one of said electrical connections is provided through conductive via formed in said multilayer structure.

38. The method of claim 34 wherein the electrical conductor of said second layer is a planar conductor.

39. The semiconductor device of claim 1 wherein said conductive layer is a metal layer.

40. A semiconductor device comprising:

a semiconductor die with an active surface;

an adhesive layer on said semiconductor die;

an electrically conductive layer attached to said semiconductor die by said adhesive layer;

an insulating layer over said electrically conductive layer; and at least one insulated conductive pathway positioned between said insulating layer and said electrically conductive layer;

a ball grid array over said insulating layer;

a first open area defined through said insulating layer, said first open area exposing a portion of said electrically conductive layer and at least a portion of said active surface;

a second open area defined through said electrically conductive layer, said second open area exposing at least a portion of said active surface; and a plurality of electrical connections from said active surface to said electrically conductive layer and said ball grid array.

41. The semiconductor device of claim 40, wherein an electrical connection is provided through said first open area to said ball grid array.

42. The semiconductor device of claim 40, wherein an electrical connection is provided through said second open area to said grid ball array.

43. The semiconductor device of claim 42, wherein said electrical connection is provided to said ball grid array by connecting to an insulated conductive pathway.

44. The semiconductor device of claim 41, wherein an electrical connection is provided through said second open area to said conductive layer.

* * * * *